US012342719B2

(12) United States Patent
Venugopal et al.

(10) Patent No.: US 12,342,719 B2
(45) Date of Patent: Jun. 24, 2025

(54) EMBEDDED THERMOELECTRIC COOLER USING THERMALLY ANISOTROPIC MESAS FOR POWER DEVICE HEAT GENERATING SOURCE TEMPERATURE REDUCTION

(71) Applicant: Texas Instruments Incorporated, Dallas, TX (US)

(72) Inventors: Archana Venugopal, Mountain View, CA (US); Jingjing Chen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/836,731

(22) Filed: Jun. 9, 2022

(65) Prior Publication Data

US 2023/0200238 A1 Jun. 22, 2023

Related U.S. Application Data

(60) Provisional application No. 63/291,340, filed on Dec. 17, 2021.

(51) Int. Cl.
*H10N 10/13* (2023.01)
*H01L 23/38* (2006.01)
*H10N 10/17* (2023.01)

(52) U.S. Cl.
CPC ............. *H10N 10/13* (2023.02); *H01L 23/38* (2013.01); *H10N 10/17* (2023.02)

(58) Field of Classification Search
None
See application file for complete search history.

(56) References Cited

U.S. PATENT DOCUMENTS

| | | | | |
|---|---|---|---|---|
| 5,872,045 A | * | 2/1999 | Lou | H01L 21/763 438/692 |
| 6,882,025 B2 | * | 4/2005 | Yeo | H01L 21/76283 257/515 |
| 2005/0258903 A1 | * | 11/2005 | Johnson | H03F 3/602 330/51 |
| 2009/0056345 A1 | * | 3/2009 | Edwards | H10N 19/00 62/3.7 |
| 2011/0023929 A1 | * | 2/2011 | Edwards | H10N 19/00 438/54 |
| 2019/0393078 A1 | * | 12/2019 | Singh | H01L 21/76283 |
| 2020/0126888 A1 | * | 4/2020 | Lofgreen | H10N 10/01 |

OTHER PUBLICATIONS

U.S. Appl. No. 17/538,238, Title 'Power Transistor IC with Thermopile', filed on Nov. 17, 2021, Edwards et al.; and U.S. Appl. No. 17/854,170, Title 'MEMS Resonator With Temperature Compensation', filed on Jun. 30, 2022, Rawat et al.

\* cited by examiner

*Primary Examiner* — Tamir Ayad
(74) *Attorney, Agent, or Firm* — Yudong Kim; Frank D. Cimino

(57) ABSTRACT

A microelectronic device including a substrate having a semiconductor material containing an embedded thermoelectric cooler with thermally anisotropic mesas between the cold terminal and the hot terminal of the embedded thermoelectric cooler adjacent to a heat source; the adjacent embedded thermoelectric cooler providing a temperature reduction for the heat source resulting in increased safe operating area (SOA) for the microelectronic device. The thermally anisotropic mesas are formed in parallel with deep trenches used as isolation in the microelectronic device.

33 Claims, 9 Drawing Sheets

EMBEDDED THERMOELECTRIC COOLER USING THERMALLY ANISOTROPIC MESAS FOR POWER DEVICE HEAT GENERATING SOURCE TEMPERATURE REDUCTION

CROSS-REFERENCE TO RELATED APPLICATIONS

This application claims the benefit of U.S. Provisional Patent Application No. 63/291,340, filed on Dec. 17, 2021, which is hereby incorporated herein by reference in its entirety.

FIELD

This disclosure relates to the field of microelectronic devices. More particularly, but not exclusively, this disclosure relates to an embedded silicon based thermoelectric cooler for microelectronic device heat generating source temperature reduction.

BACKGROUND

As microelectronic devices trend towards higher power and smaller size, thermal management become more difficult. Local hot spots from heat generating sources may degrade device performance and reliability. In next generation of devices, there is a desire to improve performance, decrease die size, and provide better thermal management of local hot spots from heat generating sources through methods of cooling the microelectronic device.

SUMMARY

This summary is provided to introduce a brief selection of disclosed concepts in a simplified form that are further described below in the detailed description including the drawings provided. This summary is not intended to limit the claimed subject matter's scope.

Disclosed examples include microelectronic devices including an integrated silicon based embedded thermoelectric cooler with anisotropic thermal mesas for thermal insulation between thermopiles of a cold terminal and thermopiles of a hot terminal of the embedded thermoelectric cooler for thermal management and hot spot reduction of heat generating sources of a microelectronic device. Disclosed examples provide an associated process flow for forming such integrated silicon based microelectronic devices.

DETAILED DESCRIPTION

Figure 1A:
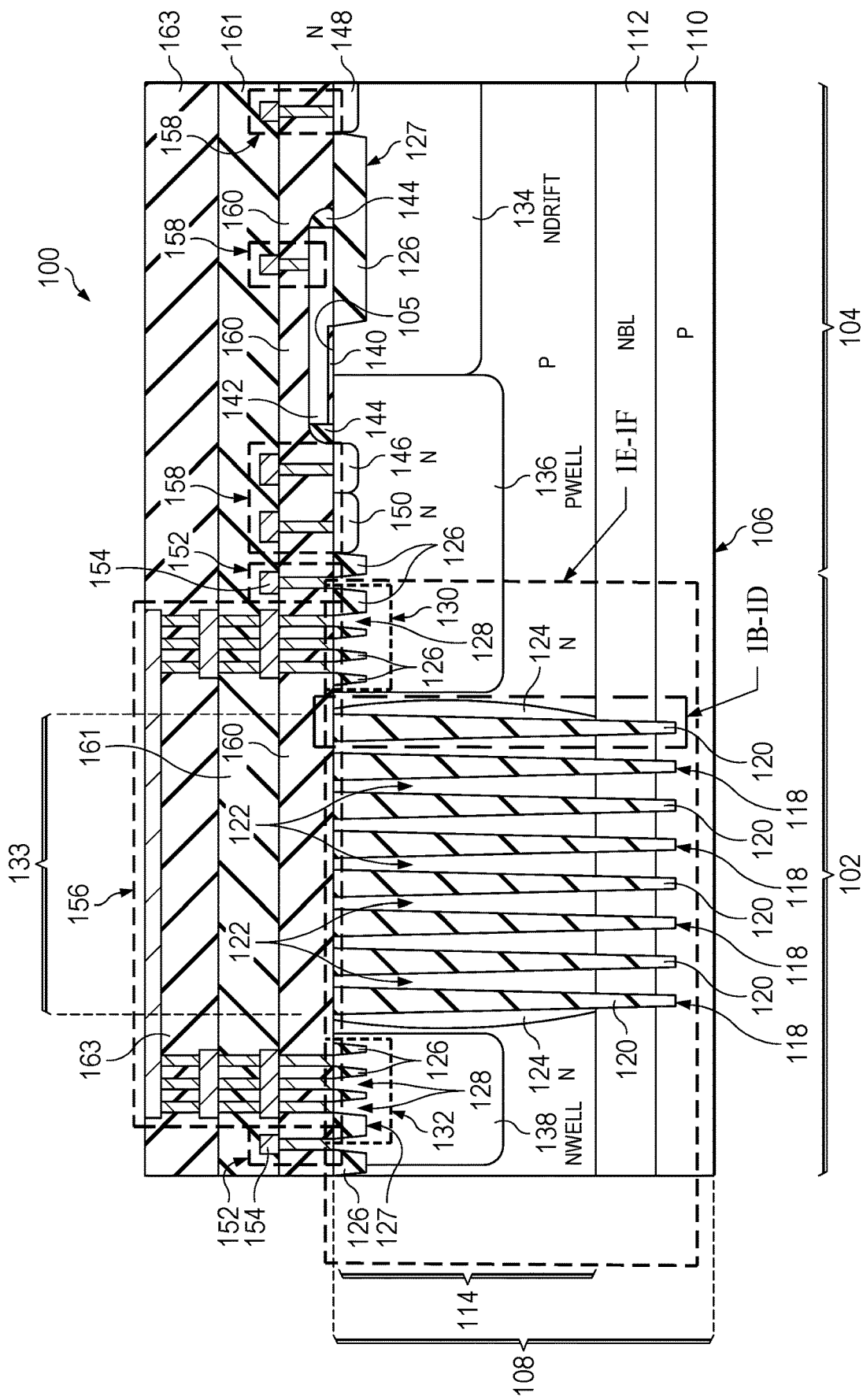
FIG. 1A is a cross section of an example microelectronic device having an integrated thermoelectric cooler containing thermally anisotropic mesas and a heat generating source (LDMOS transistor in this example).

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), thermal growth techniques or deposition techniques such as chemical vapor deposition (CVD), physical vapor deposition (PVD), PECVD, or atomic layer deposition (ALD), for example. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

It is noted that terms such as top, bottom, and under may be used in this disclosure. These terms should not be construed as limiting the position or orientation of a structure or element, but should be used to provide spatial relationship between structures or elements. For the purposes of this disclosure, the term lateral refers to a direction parallel to a plane of the instant top surface of the microelectronic device and the term vertical is understood to refer to a direction perpendicular to the plane of the instant top surface of the microelectronic device.

Thermal management and heat generating source temperature reduction of high-power elements are important for high power microelectronic device reliability and improving the safe operating area (SOA) of microelectronic devices. An embedded thermoelectric cooler may aid in thermal management by placing the cold terminal of the embedded thermoelectric cooler laterally adjacent to a heat generating area of the high-power element of the microelectronic device. The embedded thermoelectric cooler contains a cold terminal which removes heat from near the heat generating source and a hot terminal more distant from the heat generating source than the cold terminal which spreads the heat to other areas of the microelectronic device. An array of thermally anisotropic mesas is between the cold terminal and the hot terminal of the thermoelectric cooler. The thermally anisotropic mesas between the hot terminal and cold terminal of the embedded thermoelectric cooler provide an advantageous thermal barrier which allows heat to be moved between the hot terminal and cold terminal through an interconnect system while minimizing thermal leakage between the cold terminal and the hot terminal through the silicon. The embedded thermoelectric cooler reduces the highest temperatures at the heat generating source and distributes that heat across the rest of the microelectronic device. The embedded thermoelectric cooler may be powered by using a transient electrical waveform from an electronic circuit within the microelectronic device. By modulating the shape and timing of the transient electrical waveform, the heat generating source temperature reduction may be modulated and adapted to the use conditions of the microelectronic device. By placing of the embedded thermoelectric cooler with the cold terminal adjacent to the heat generating source, a means to dissipate the abrupt temperature changes from local hot spots during transient heating events is achieved. Having at least 0.10 atomic percent germanium in the thermally anisotropic mesas reduces the thermal conduction between the upper end of the thermally anisotropic mesas at the top surface of the silicon and lower end of the thermally anisotropic mesas in the base wafer which may advantageously improve the thermal barrier between the cold terminal and the hot terminal of the embedded thermoelectric cooler. The thermally anisotropic mesas are formed concurrently with deep trenches in current process flows which include deep trench processing for device isolation.

FIG. 1A is a cross section of an example microelectronic device 100 comprising an embedded thermoelectric cooler 102 and a heat source 104. The microelectronic device 100 includes an array of thermally anisotropic mesas 122 between the thermopiles 128 of the cold terminal 130 and the thermopiles 128 of the hot terminal 132 of the embedded thermoelectric cooler 102. In FIG. 1A, the thermopiles 128 of the cold terminal 130 are in a region of p-type body well 136 (second conductivity type). The thermopiles of the hot terminal 132 may be in a n-type well region 138 (first conductivity type). The thermopiles 128 of the cold terminal 130 and the thermopiles 128 of the hot terminal 136 being of opposite conductivity. While FIG. 1A shows the cold terminal 130 in a shared p-type body well 136 with the heat generating source 104, the cold terminal 130 may be in an independent well region of the second conductivity type (not specifically shown). The thermopiles 128, and the thermally anisotropic mesas 122 are less than 60 nm wide at the surface 105 of the silicon with no dimensional restriction in length.

In FIG. 1A, the heat generating source 104 is shown as a laterally diffused MOS transistor (LDMOS) transistor. Other examples of heat generating sources (not specifically shown) include, a drain extended metal oxide semiconductor (DEMOS) transistor, a bipolar junction transistor, a junction field effect transistor, a gated bipolar, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, a resistor, an amplifier, and a Schottky diode. The remaining discussion refers to an LDMOS transistor as the heat generating source 104. One of ordinary skill in the art will understand to replace the elements of the LDMOS transistor with the appropriate elements of the desired heat generating device. Although NMOS LDMOS transistors are described herein as the heat generating source 104, it is clear that p-channel (PMOS) LDMOS transistors can be formed when n-doped regions are substituted by p-doped regions and p-doped regions are substituted by n-doped regions.

The microelectronic device 100 includes a substrate 106 that has silicon semiconductor material 108, referred to herein as the silicon 108. The substrate 106 may be, for example, part of a bulk semiconductor wafer, part of a semiconductor wafer with an epitaxial layer, part of a silicon-on-insulator (SOI) wafer, or other structure suitable for forming the microelectronic device 100.

The substrate 106 may include an optional n-type buried layer (NBL) 112 on a base wafer 110. The base wafer 110 may be p-type with a dopant concentration of $1\times10^{17}$ atoms/cm$^3$ to $1\times10^{18}$ atoms/cm$^3$, for example. Alternatively, the base wafer 110 may be lightly doped, with an average dopant concentration below $1\times10^{16}$. The NBL 112 may be 2 microns to 10 microns thick, by way of example, and may have a dopant concentration of $1\times10^{16}$ atoms/cm$^3$ to $1\times10^{17}$ atoms/cm$^3$. The substrate 106 may include an epitaxial layer 114 of silicon on the NBL 112. The epitaxial layer 114 is part of the silicon 108, and may be 2 microns to 12 microns thick, for example. The epitaxial layer 114 may be p-type, with a dopant concentration of $1\times10^{15}$ atoms/cm$^3$ to $1\times10^{16}$ atoms/cm$^3$, by way of example. In versions of this example in which the substrate 106 lacks the NBL 112, the epitaxial layer 114 may be directly on the base wafer 110. The substrate 106 may also include an optional blanket p-type buried layer (PBL) (not specifically shown) in the epitaxial layer 114. The PBL layer may be 1 micron to 5 microns thick, and may have a dopant concentration of $1\times10^{15}$ atoms/cm$^3$ to $3\times10^{17}$ atoms/cm$^3$, by way of example.

The thermally anisotropic mesas 122, deep trenches 118, and deep trench gap fill material 120 of the thermally anisotropic mesa region 133 are between the cold terminal 130 of the embedded thermoelectric cooler 102 and hot terminal 132 of the embedded thermoelectric cooler 102. The thermally anisotropic mesas 122 and deep trenches 118 extend from the top surface 105 of the substrate 106 into silicon 108. The deep trenches 118 may extend through the NBL 112 into the base wafer 110. The thermally anisotropic mesas 122 advantageously provide thermal insulation between the thermopiles 128 of the cold terminal 130 of the embedded thermoelectric cooler 102 and the thermopiles 128 of the hot terminal 132 of the embedded thermoelectric cooler 102.

Figure 1B:
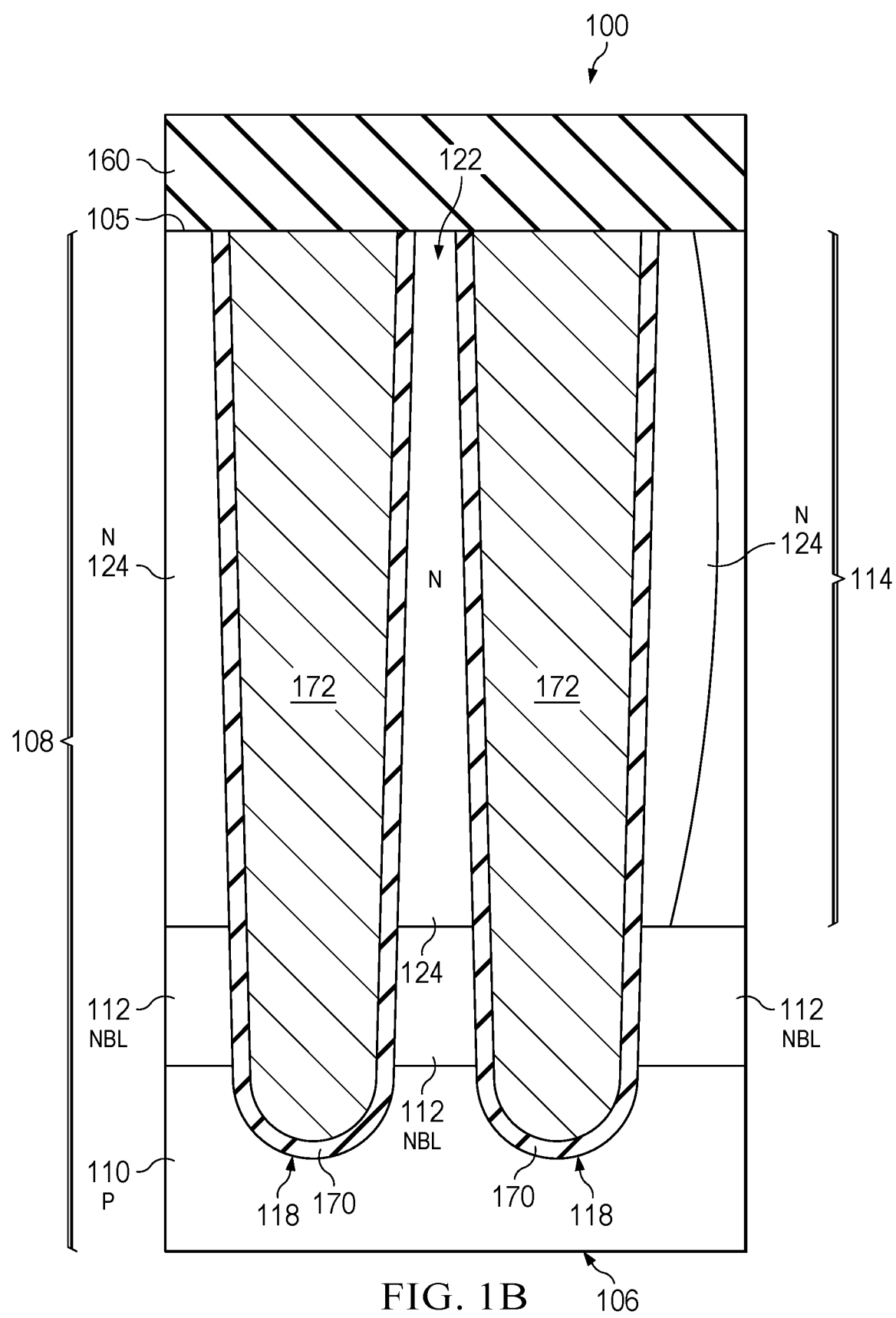
FIG. 1B is a detailed cross section of a thermally anisotropic mesa and laterally adjacent deep trenches with a trench liner.
Figure 1C:
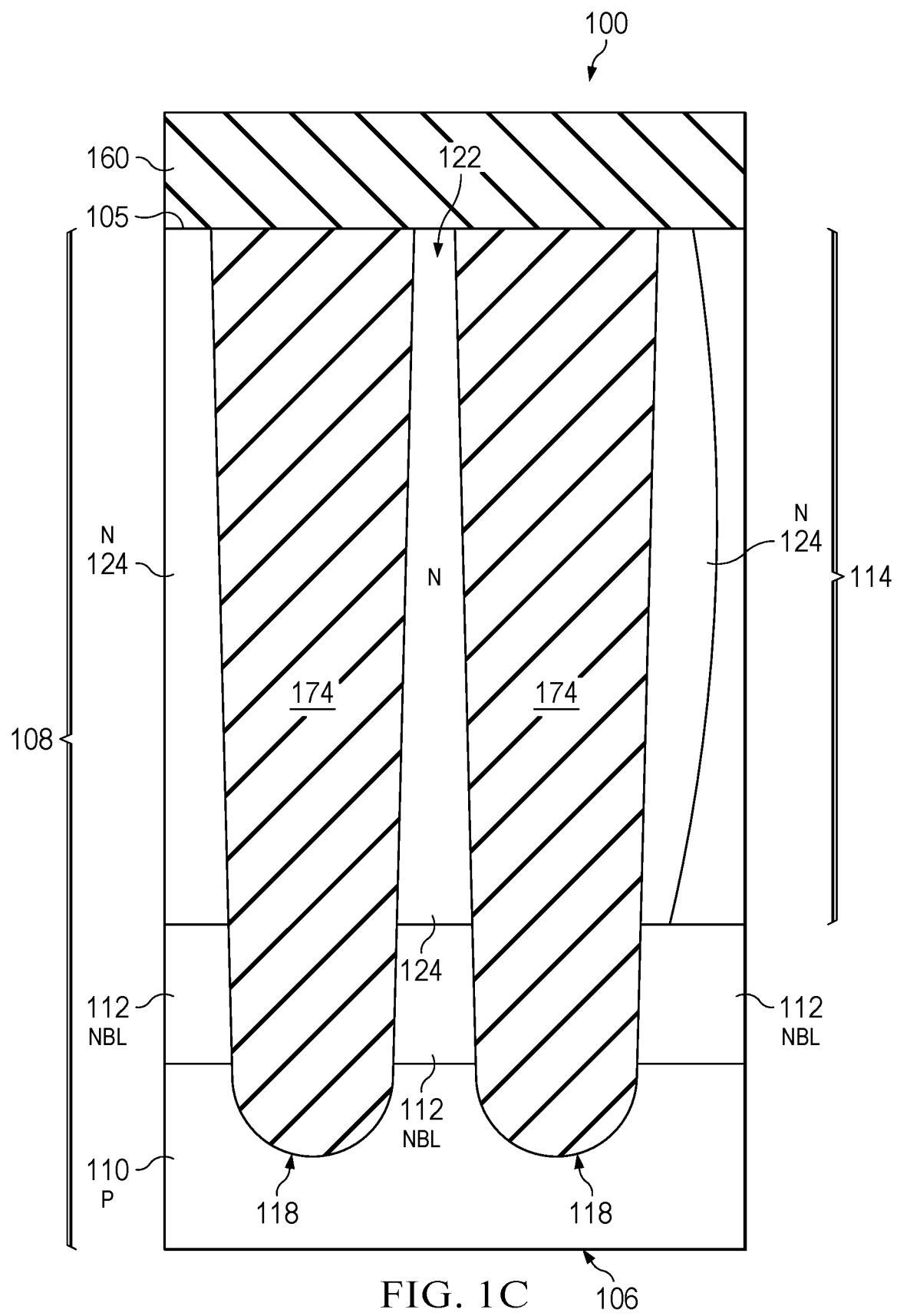
FIG. 1C is a detailed cross section of a thermally anisotropic mesa and laterally adjacent deep trenches without a trench liner.
Figure 1D:
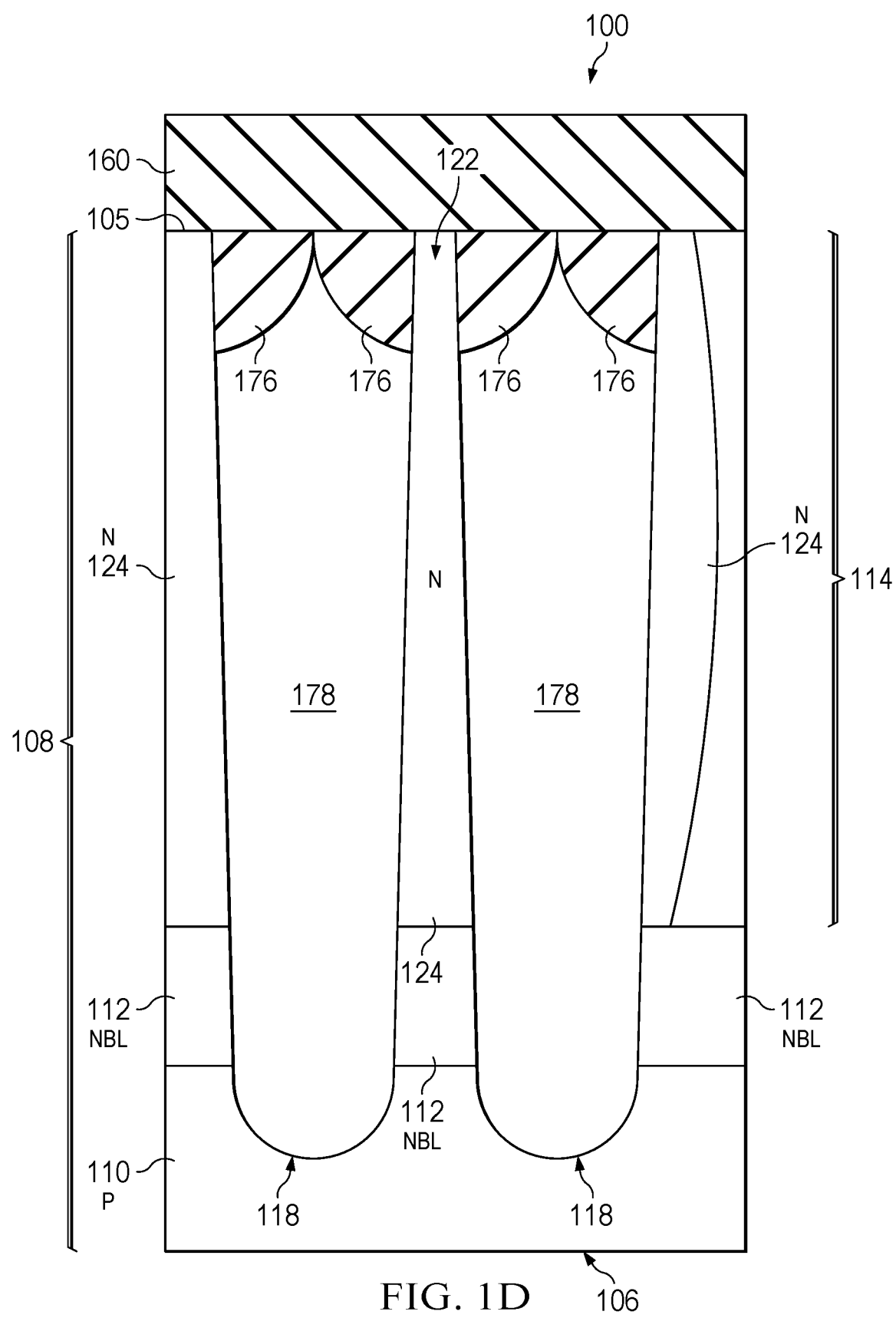
FIG. 1D is a detailed cross section of a thermally anisotropic mesa and laterally adjacent deep trenches which include an air gap.

The deep trench gap fill material 120 may be filled with a deep trench sidewall dielectric layer 170 and an electrically conductive deep trench fill material 172 as shown in FIG. 1B, a deep trench fill material 174 without a deep trench sidewall dielectric layer 170 as shown in FIG. 1C, or by an air gap 178 as shown in FIG. 1D.

The microelectronic device 100 of FIG. 1A may contain a field oxide 126 in a field oxide trench 127 (configured in this example as shallow trench isolation) which provides isolation for the LDMOS transistor. The field oxide 126 also provides isolation between the thermopiles 128 of the embedded thermoelectric cooler 102. Additional components in the silicon 108 of the embedded thermoelectric cooler 102 include a deep well region 124, a p-type body well region 136, and a n-type well region 138. While the example in FIG. 1A is shown with the thermopiles 128 of the cold terminal 130 in the p-type body well region 136 and the thermopiles 128 of the hot terminal 132 in the n-type well region 138, the case where the thermopiles 128 of the cold terminal 130 are in a n-type well region and the thermopiles 128 of the hot terminal 132 are in a p-type well region is also within the scope of the disclosure.

The heat generating source 104 example LDMOS of FIG. 1A contains an n-drift region (NDRIFT) 134, a p-type body well region 136, a gate dielectric layer 140, a gate electrode 142, sidewall spacers 144, a source region 146, a drain region 148, and a back gate region 150. The p-type body well region 136 may be a shared well region between the embedded thermoelectric cooler 102 and the heat generating source 104.

Above the top surface 105 of the embedded thermoelectric cooler 102 and the heat generating source 104 a silicide (not specifically shown) may be formed over silicon 108 exposed at the top surface 105 and over the gate electrode 142 to improve resistance to contacts which are formed through the pre-metal dielectric (PMD) layer 160. The PMD layer 160 is over the top surface 105, the gate electrode, and the field oxide 126. The source region 146, drain region 148, back gate region 150, and the gate electrode 142 are electrically connected through contacts and a heat generating source interconnect system 158. The embedded thermoelectric cooler 102 is connected to thermoelectric terminals 154 through contacts and interconnects, and the hot terminal 132 of the embedded thermoelectric cooler 102 is connected to the cold terminal 130 of the embedded thermoelectric cooler 102 through an embedded thermoelectric cooler interconnect system 156. The embedded thermoelectric cooler interconnect system 156 contains one or more metal levels, one or more via levels, and may have a first inter-level dielectric (ILD) 161, and may have a second ILD 163.

FIG. 1B is a detailed section of a thermally anisotropic mesa 122 in the epitaxial layer 114 and the silicon 108 with deep trenches 118 adjacent to the thermally anisotropic mesa 122 highlighted in FIG. 1A. FIG. 1B shows an embodiment of the disclosure in which the deep trenches 118 adjacent to the thermally anisotropic mesa 122 are formed concurrently with deep trenches in other parts of the semiconductor device 100 using existing semiconductor processes for deep trench isolation and deep trench capacitors. The deep trenches 118 are configured with a deep trench sidewall dielectric layer 170 and an electrically conductive deep trench fill material 172. The electrically conductive deep trench fill material 172 may be a conductive material such as polysilicon. In the example shown in FIG. 1B, the deep trenches 118 are etched through the NBL 112 and into the base wafer 110. The deep trenches may be surrounded between the top surface 105 to the NBL 112 by the deep well region 124. The PMD layer 160 is over the top surface 105 of the silicon 108.

FIG. 1C is a detailed section of a thermally anisotropic mesa 122 in the epitaxial layer 114 and the silicon 108 with deep trenches 118 adjacent to the thermally anisotropic mesa 122 highlighted in FIG. 1A. FIG. 1C shows a second embodiment of the disclosure in which the deep trenches 118 adjacent to the thermally anisotropic mesa 122 are configured with a deep trench fill material 174 directly contacting the silicon 108. The deep trench fill material 174 is a dielectric material such as silicon dioxide or silicon nitride. In the example shown in FIG. 1C, the deep trenches 118 are etched through the NBL 112 and into the base wafer 110. The deep trench may be surrounded between the top surface 105 to the NBL 112 by the deep well region 124. The PMD layer 160 is over the top surface 105 of the silicon 108.

FIG. 1D is a detailed section of a thermally anisotropic mesa 122 in the epitaxial layer 114 and the silicon 108 with deep trenches 118 adjacent to the thermally anisotropic mesa 122 highlighted in FIG. 1A. FIG. 1D shows a third embodiment of the disclosure in which the deep trenches 118 adjacent to the thermally anisotropic mesa 122 are configured with a poor gap fill dielectric 176, and an air gap 178 within the deep trenches 118 below the poor gap fill dielectric 176. In the example shown in FIG. 1D, the deep trenches 118 are etched through the NBL 112 and into the base wafer 110. The deep trench may be surrounded between the top surface 105 to the NBL 112 by the deep well region 124. The PMD layer 160 is over the top surface 105 of the silicon 108. The PMD layer 160 is over the top surface 105 of the silicon 108.

Figure 1E:
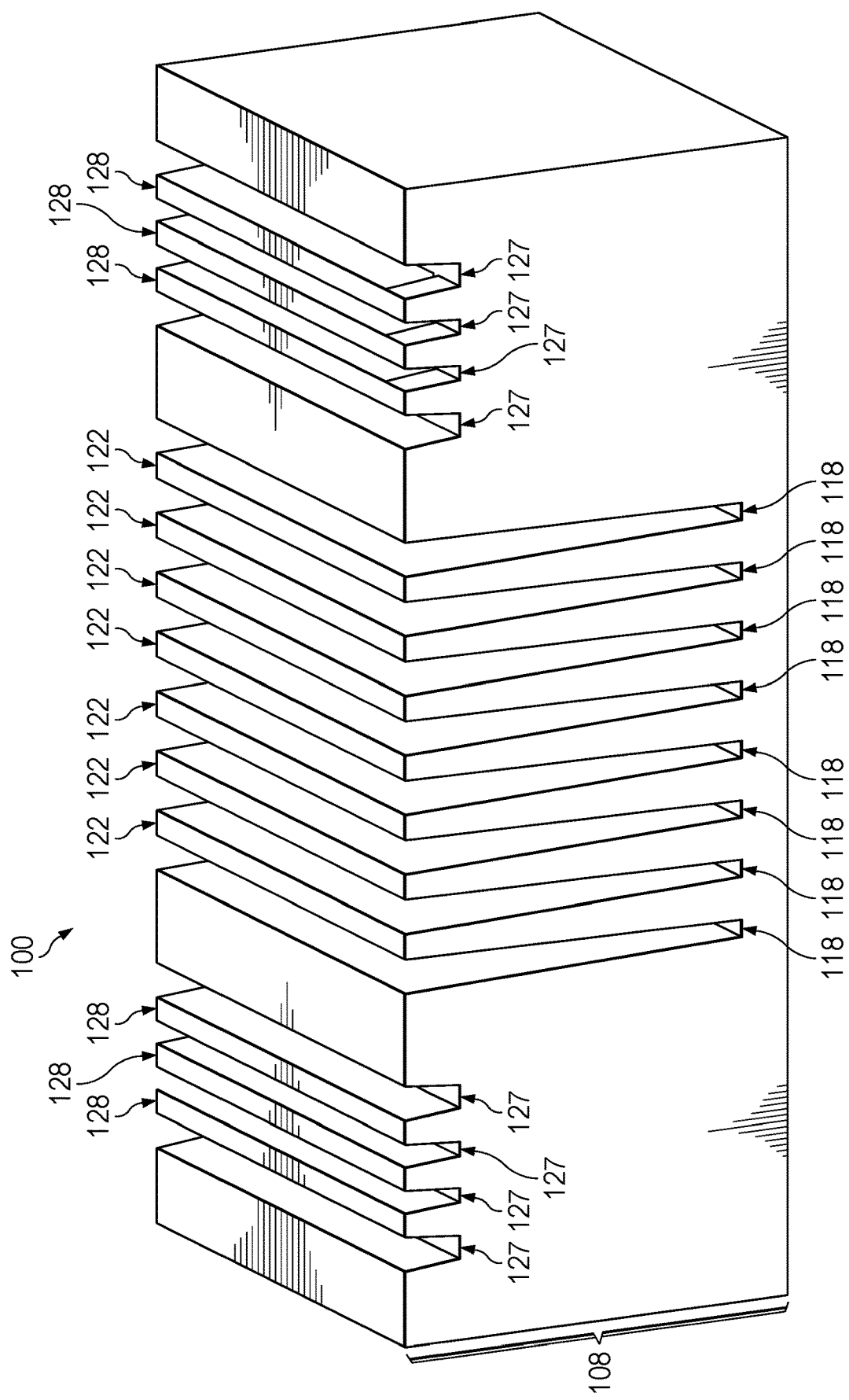
FIG. 1E is a perspective view of thermally anisotropic mesas and laterally adjacent deep trenches as well as thermopiles and laterally adjacent trenches.

FIG. 1E shows a perspective view of the embedded thermoelectric cooler 102 of the microelectronic device 100. For clarity, the implants, deep trench fill, field oxide, PMD layer 160, contacts, and interconnects have been removed. The perspective view shows the thermally anisotropic mesas 122 and thermopiles 128 as linear mesas running the length of the embedded thermoelectric cooler 102. Likewise, the deep trenches 118 and field oxide trenches 127 are linear trenches in the silicon 108. The thermally anisotropic mesas 122 may have a top width less than 60 nm and have a height of at least 10 microns. The thermopiles 128 may have top width of less than 60 nm and a height greater than 250 nm.

Figure 1F:
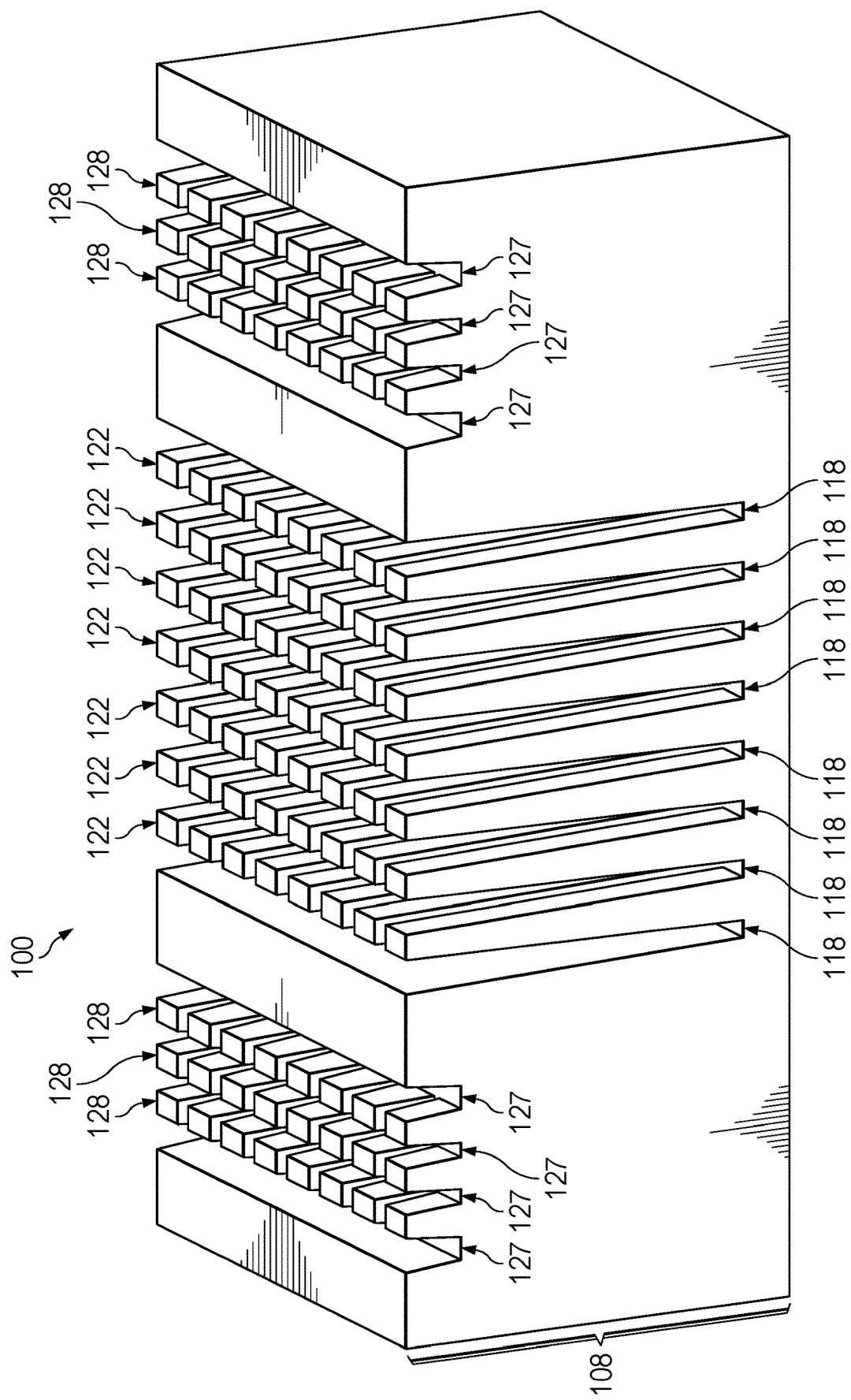
FIG. 1F is a perspective view of thermally anisotropic mesas and laterally adjacent deep trenches as well as thermopiles and laterally adjacent trenches.

FIG. 1F shows a perspective view of a second embodiment of the embedded thermoelectric cooler 102 of the microelectronic device 100. For clarity, the implants, electrically conductive deep trench fill material 172, field oxide 126, PMD layer 160, contacts, and interconnects have been removed. The perspective view shows the thermally anisotropic mesas 122 and thermopiles 128 as pillars of mesas running the length of the embedded thermoelectric cooler 102. Likewise, the deep trenches 118 and the field oxide trenches 127 in the silicon 108 surround each of the thermally anisotropic mesas 122 and thermopiles 128. The thermally anisotropic mesas 122 may have a top width of less than 60 nm and a height greater than 10 microns. The thermopiles 128 may have a top width of less than 60 nm and a height of greater than 250 nm.

Figure 2:
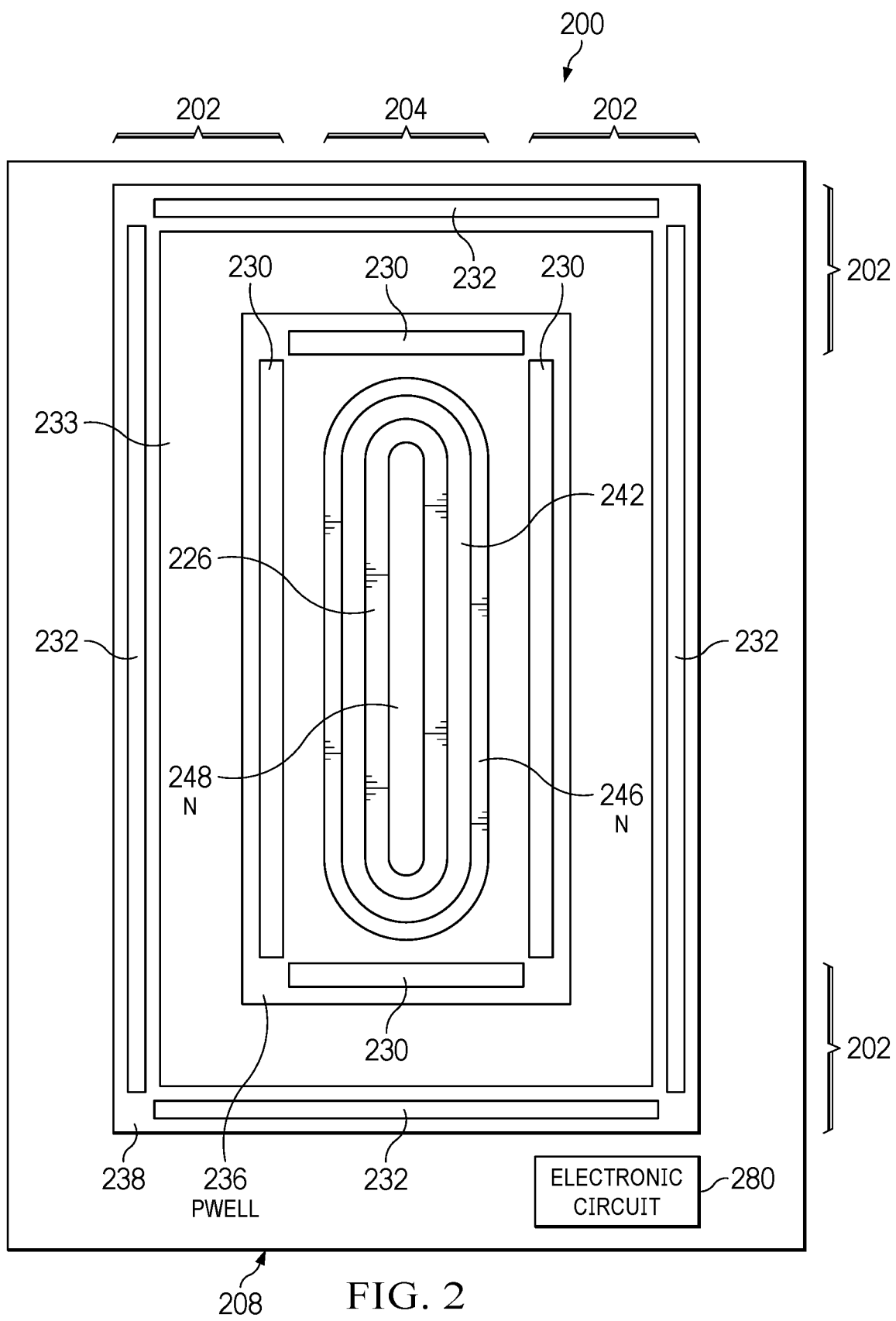
FIG. 2 is a top-down view of an example microelectronic device having a power transistor and an embedded thermoelectric cooler in an example configuration.

FIG. 2 shows a top-down view of a microelectronic device 200 containing an embedded thermoelectric cooler 202 and a heat generating source 204 in the silicon 208. In FIG. 2, the heat generating source 204 is an LDMOS transistor. In the example shown in FIG. 2, The embedded thermoelectric cooler 202 is placed at four locations adjacent to the heat generating source 204, but could be placed in other geometries adjacent to the heat generating source 204. Additionally, placing the embedded thermoelectric cooler 202 in less than or more than four locations adjacent to the heat generating source 204 is possible. The heat generating source 204 LDMOS transistor consists of a source region 246, a drain region 248, a gate electrode 242, and field oxide 226. Adjacent to the source region 246 on each side of the heat generating source 204 is a cold terminal 230 of the embedded thermoelectric cooler 202. Adjacent to the cold terminal 230 of the embedded thermoelectric cooler 202, and between the cold terminal 230 and the hot terminal 232 is a region containing the thermally anisotropic mesas 233. The thermally anisotropic mesas 233 may be continuous around the heat generating source 204 as shown in FIG. 2, or they may be segmented (not specifically shown). The hot terminal 232 of the embedded thermoelectric cooler 202 is within a region of n-well 238 and the cold terminal 230 is within a region of p-well 236. Additionally, the microelectronic device 200 contains an electronic circuit 280, also in the silicon 208 which generates a current with a waveform to power the embedded thermoelectric cooler 202.

Figure 3:
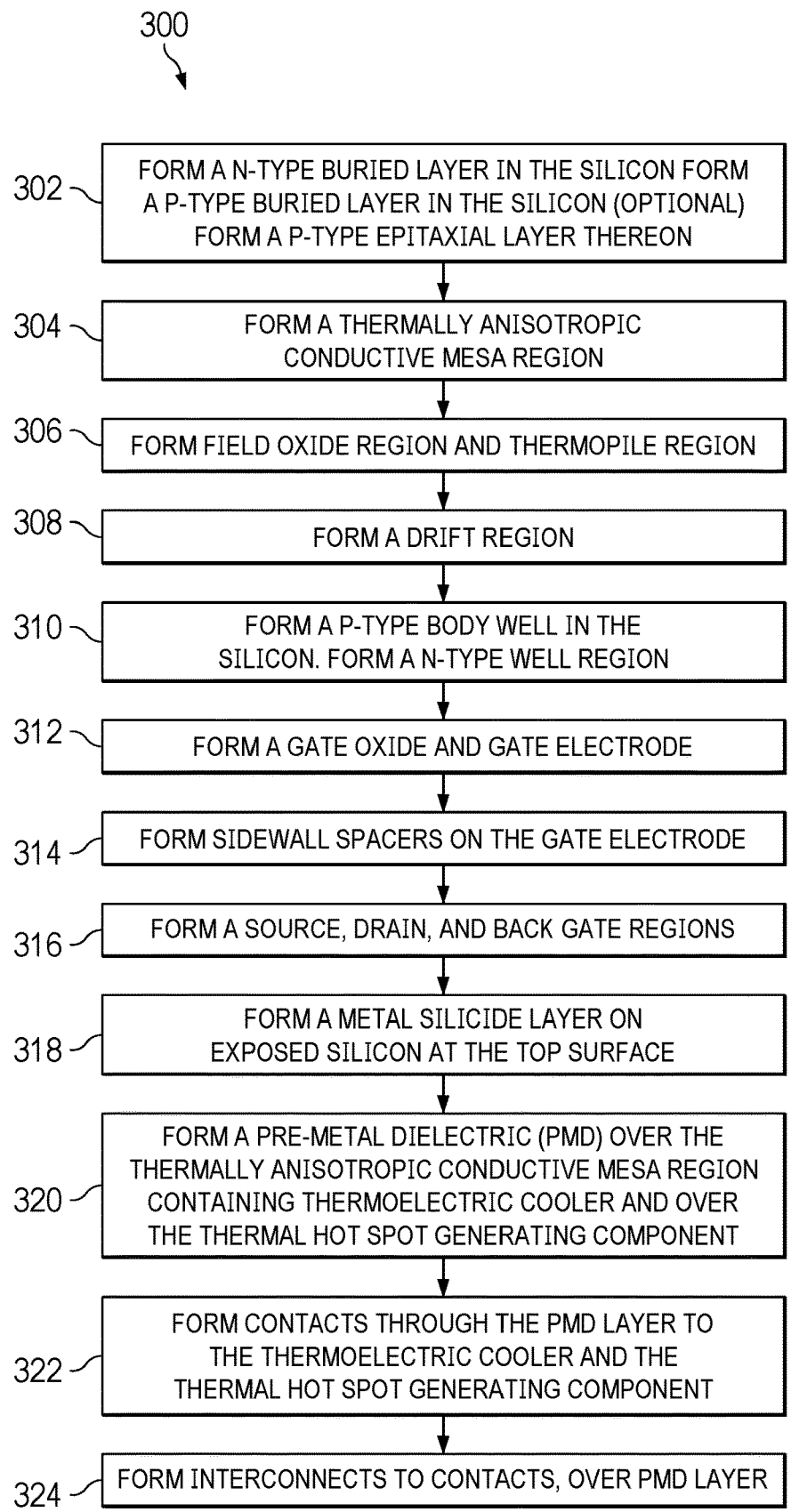
FIG. 3 presents a flowchart of an example method of forming the microelectronic device of FIG. 1A.

FIG. 3 refers to flowchart of an example method 300 for forming the heat generating source 104 and embedded thermoelectric cooler 102 of FIG. 1A. Structural elements referred to in the steps of the method 300 are shown in FIG. 1A.

The method 300 includes step 302, which may include optionally forming the NBL 112 on the base wafer 110. The NBL 112 may be formed by forming a hard mask, not explicitly shown, over the base wafer 110 that exposes the base wafer 110 in an area for the NBL 112. N-type dopants, such as antimony and optionally arsenic are implanted into the base wafer 110 at a dose of $5 \times 10^{14}$ ions/cm$^2$ to $3 \times 10^{15}$ ions/cm$^2$, where exposed by the hard mask. The substrate 106 is heated to diffuse and activate the implanted n-type dopants to form the NBL 112. After the formation of the NBL 112, the epitaxial layer 114 may be formed by an epitaxial process. In versions of this example in which the substrate 106 lacks the NBL 112, the epitaxial layer 114 may be formed on the base wafer 110.

The method 300 continues with step 304 includes formation of the thermally anisotropic mesas 122. An optional deep well region 124 may be formed in the silicon 108, extending from the top surface 105 of the silicon 108 to the NBL 112. The deep well region 124 is n-type in this example, but may be p-type. The deep well region 124 may be formed by implanting dopants such as phosphorus, into the silicon 108, followed by a thermal drive to diffuse the implanted dopants to the NBL 112 and activate the implanted dopants. The deep well region 124 may have an average concentration of the dopants that is 2 to 10 times greater than an average concentration of dopants in the silicon 108 outside of the deep well region 124.

A pad oxide layer (not specifically shown) may be formed on the top surface 105 of the silicon 108. The pad oxide layer may include primarily silicon dioxide, may be formed by a thermal oxidation process or a chemical vapor deposition (CVD) process, and may have a thickness of 50 nanometers to 200 nanometers, by way of example. A nitride cap layer (not specifically shown) may be formed on the pad oxide layer. The nitride cap layer may include primarily silicon nitride, may be formed by a low-pressure chemical vapor deposition (LPCVD) furnace process, and may have a thickness of 100 nanometers to 500 nanometers, for example. A hard mask layer (not specifically shown) may be formed on the nitride cap layer. The hard mask layer may include primarily silicon dioxide, may be formed by a plasma enhanced chemical vapor deposition (PECVD) process, and may have a thickness of 1 micron to 3 microns. The pad oxide layer may provide stress relief between the silicon 108 and a combination of the nitride cap layer and the hard mask layer. The nitride cap layer may provide a stop layer for subsequent etch and planarization processes. The hard mask layer may provide a hard mask during a subsequent deep trench etch process to form the deep trenches 118. Next, a trench mask (not specifically shown) may be formed on the hard mask layer with openings which expose the hard mask layer in an area for the deep trenches 118. The trench mask may include photoresist, and may optionally include anti-reflection material such as a bottom anti-reflection coat (BARC). The trench mask may be formed by a photolithographic process.

A deep trench etch process (not specifically shown) is performed to form the deep trenches 118 and the thermally anisotropic mesas 122 in the silicon 108. The deep trench etch process may include multiple steps. In one implementation for example, a hard mask etch may be first performed to remove the hard mask layer where exposed by the trench mask, and a silicon etch may then be performed to remove the nitride cap layer, the pad oxide layer, and the silicon 108 in regions that are exposed by the hard mask layer to form the deep trenches 118 and the thermally anisotropic mesas 122. The deep trenches 118 and the thermally anisotropic mesas 122 extends from the top surface 105 of the substrate 106 into the NBL 112 in this example. Additionally, a germanium implant having at least 0.10 percent germanium may be added in the silicon which encompasses the thermally anisotropic mesas. Having at least 0.10 atomic percent germanium in the thermally anisotropic mesas 122 reduces the thermal conduction between the upper end of the thermally anisotropic mesas 122 at the top surface 105 of the silicon and lower end of the thermally anisotropic mesas 122 in the base wafer 110 which may advantageously improve the thermal barrier performance of the thermally anisotropic mesas 122.

A deep trench sidewall dielectric layer 170 shown in FIG. 1B may formed in the deep trenches 118, contacting the silicon 108 of the substrate 106. The deep trench sidewall dielectric layer 170 may include a single layer of a silicon-nitrogen compound or a silicon dioxide compound or may include multiple layers of silicon-nitrogen compounds, silicon dioxide compounds, or other dielectric materials.

An electrically conductive deep trench fill material 172 shown in FIG. 1B may be formed in the deep trenches 118 on the deep trench sidewall dielectric layer 170. The electrically conductive deep trench fill material 172 includes primarily silicon, and may be implemented as polycrystalline silicon, commonly referred to as polysilicon. Alternatively, the electrically conductive deep trench fill material 172 may be implemented as amorphous silicon, or semi-amorphous silicon. The electrically conductive deep trench fill material 172 may have an average concentration of dopants of $5 \times 10^{18}$ cm$^{-3}$ and $1 \times 10^{20}$ cm$^{-3}$.

The electrically conductive deep trench fill material 172 and the deep trench sidewall dielectric layer 170 above the top surface 105 may be removed by a planarization process, such as a chemical mechanical polish (CMP) process or an etch back process (not specifically shown). The process of removing the electrically conductive deep trench fill material 172 and the deep trench sidewall dielectric layer 170 on the top surface 105 of the substrate 106 leaves the electrically conductive deep trench fill material 172 and the deep trench sidewall dielectric layer 170 in the deep trenches 118 with thermally anisotropic mesas 122 between the deep trenches 118. The process of removing the electrically conductive deep trench fill material 172 and the deep trench sidewall dielectric layer 170 may leave the nitride cap layer and the pad oxide layer on the top surface 105 of the substrate 106 which may subsequently be removed by a plasma or wet etch process.

The method 300 continues with step 306 includes forming the thermopiles 128 of the embedded thermoelectric cooler 102 and field oxide 126 for the heat generating source 104. A pad oxide and a CMP stop layer (not specifically shown) are deposited over the top surface 105 of the silicon. A photomask (not specifically shown) serves the function of masking the CMP stop layer and defines regions for the thermopiles 128 and areas of field oxide 126. The photomask may include a light sensitive organic material that is coated, exposed and developed. The photomask step is followed by a plasma etch process (not specifically shown) which removes the CMP stop layer, the pad oxide, and the epitaxial layer 114 to form the thermopiles 128 and field oxide trenches 127 for the field oxide 126. The field oxide trench may be between 250 nm and 1000 nm in depth. The field oxide isolates the thermopiles 128 from each other as well as forms the field oxide 126 of the heat generating source 104. Additionally, a germanium implant having at least 0.10 percent germanium may be added in the silicon which encompasses the n-type thermopiles and the p-type thermopiles.

The field oxide 126 is formed in the field oxide trenches 127 and over the CMP stop layer. The field oxide 126 may include primarily silicon dioxide, or silicon dioxide-based dielectric material, formed by one or more CVD processes alternated with etch-back processes to provide complete filling of the field oxide trench. The field oxide 126 is planarized so that the field oxide 126 does not extend over the top surface 105 of the silicon 108. The field oxide 126 may be planarized by a CMP process (not specifically shown). After the field oxide 126 is planarized, the CMP stop layer is removed. The CMP stop layer may be removed by a wet etch process using an aqueous solution of phosphoric acid at 140° C. to 170° C. The pad oxide may optionally be removed by a wet etch process using an aqueous solution of buffered hydrofluoric acid. The field oxide 126 forms a field oxide stress relief region for the heat generating source 104, and isolation between the thermopiles 128 of the embedded thermoelectric cooler 102.

When the heat generating source is an LDMOS, the method 300 may continue with step 308. Step 308 includes forming the NDRIFT drain drift region 134 of the heat generating source 104. A photomask (not specifically shown) is deposited and patterned with an opening where a drift region (NDRIFT) implant is to be implanted in the silicon 108 to form an NDRIFT drain drift region 134 within the exposed areas of the epitaxial layer 114. The implant to define the NDRIFT drain drift region 134 may occur in multiple steps. In a series of implants, phosphorus may be implanted at a total dose of between $3 \times 10^{12}$ cm$^{-2}$ and $6.6 \times 10^{12}$ cm$^{-2}$ with energies between 0.5 mega-electron volts (MeV) and 2.8 MeV. Arsenic may also be implanted with a dose of between $1.5 \times 10^{12}$ cm$^{-2}$ and $3.0 \times 10^{12}$ with an energy of between 180 kilo-electron volts (keV) and 460 keV. All of the implant process uses the same photomask to complete the formation of the NDRIFT drain drift region 134.

The method 300 may then continue with step 310 which includes forming the p-type body well region 136 and a n-type well region 138. A p-type body well implant process (not specifically shown) implants p-type dopants into a portion of the epitaxial layer 114 laterally adjacent to the NDRIFT drain drift region 134 to form the p-type body well region 136. The p-type dopants may include boron. Besides boron, the p-type dopants can include indium. Indium, being a relatively large atom, has the advantage of a low diffusion coefficient relative to boron. In the case of a boron implant, the well ion implant process energy and dose used should generally be sufficient to enable formation of a channel laterally and to be suppress body NPN effects during operation of the heat generating source 104. For example, a series of boron implants with an energy between 80 keV and 3 MeV, and doses between $4.0 \times 10^{12}$ cm$^{-2}$ to $1.5 \times 10^{14}$ cm$^2$, with a tilt angle of less than 10 degrees may be used to implant the p-type body well region 136. A pattern and implant step (not specifically shown) are used to define the n-type well region 138. An arsenic with a dose between $6.0 \times 10^{13}$ cm$^{-2}$ and $8.0 \times 10^{15}$ cm$^{-2}$ with an energy between 60 keV to 120 keV with a tilt angle of between 0 degrees and 45 degrees may be used for the n-type well region 138 dopant.

The method 300 may then continue with step 312 which includes forming the gate dielectric layer 140 and gate electrode 142. A gate dielectric layer 140 is first formed in a high temperature furnace operation or a rapid thermal process (not specifically shown). The gate dielectric layer 140 thickness can range from approximately 3 nm to 15 nm for silicon dioxide or a silicon oxynitride (SiON) gate dielectric that is slightly thinner but with a higher dielectric constant than that of silicon dioxide, which is about 3.9, by way of example. After the gate dielectric layer 140 is formed, a layer used to form the gate electrode 142 is deposited by a gate deposition process on the wafer using any of a number of silane-based precursors. Polycrystalline silicon is one example of a material for the gate electrode 142, however a metal gate or CMOS-based replacement gate electrode process can also be used to provide the gate electrode 142. After the gate dielectric layer 140 and the layer used for the gate electrode 142 are formed, a photomask is deposited and patterned. A plasma etch process is used to define the gate electrode 142. After the plasma etch process is complete, photomask is removed and a wet or dry process is used to clean the wafer surface.

The method 300 may then continue with step 314 includes forming sidewall spacers 144 on the gate electrode 142. The sidewall spacers 144 may be formed by forming one or more conformal layers of dielectric material over the top surface 105 of the silicon 108 including the gate electrode 142. The dielectric material is subsequently removed from horizontal surfaces, that is, surfaces generally parallel to the top surface 105 of the silicon 108, by an anisotropic etch process such as an RIE process, leaving the dielectric material on the lateral surfaces of the gate electrode 142. The sidewall spacers 144 may include a dielectric material such as silicon dioxide and silicon nitride. The sidewall spacers 144 may extend 100 nanometers to 500 nanometers from the lateral surfaces of the gate electrode 142.

The method 300 may then continue with step 316 which includes forming a source region 146, drain region 148, and a back gate region 150. A series of patterning steps (not specifically shown) and an ion implantation steps (not specifically shown) are used to implant a source region 146 in the p-type body well region 136, implant a drain region 148 in the NDRIFT drain drift region 134, and implant a back gate region 150. The source region 146 and drain region 148 implantation may occur in one or more steps with implant species including one or more of phosphorus and arsenic with an overall dose of between $5 \times 10^{13}$ cm$^{-2}$ and $4.5 \times 10^{15}$ cm$^{-2}$ and an energy between 2 keV and 80 keV. The ion implantation step uses an edge of the sidewall spacers 144 abutting the source region 146, and the drain region 148 to self-align the implants for the source region 146 and the drain region 148 respectively.

The method 300 may then continue with step 318, which includes forming the metal silicide (not specifically shown) on the top surface 105 of the silicon 108 and on the polysilicon of the gate electrode 142. The layer of metal which forms the silicide may include platinum, tungsten, titanium, cobalt, nickel, chromium, or molybdenum, by way of example. A cap layer of titanium nitride or tantalum nitride may be formed over the layer of metal. Subsequently, the microelectronic device 100 is heated to react the layer of metal with the silicon 108 and the polysilicon of the gate electrode 142 to form the metal silicide. Unreacted metal is removed from the microelectronic device 100, leaving the metal silicide in place. The unreacted metal may be removed by a wet etch process using an aqueous mixture of sulfuric acid and hydrogen peroxide, or an aqueous mixture of nitric acid and hydrochloric acid, by way of example. The metal silicide may provide electrical connections to the source region 146, the drain region 148, the back gate region 150, the gate electrode 142, the thermopiles 128, and to the thermoelectric taps 152 with lower resistances compared to a similar microelectronic device 100 without a metal silicide.

The method 300 continues with step 320, which includes forming the PMD layer 160 over the microelectronic device 100. The PMD layer 160 may include a PMD liner (not specifically shown) over the top surface 105 of the silicon 108. The PMD liner may be formed in one or more sublayers by one or more CVD processes. The PMD liner is non-conducting. A silicon nitride PMD liner sublayer may be formed by a low pressure chemical vapor deposition (LPCVD) process using dichlorosilane and ammonia, or by a PECVD process using bis(tertiary-butyl-amino)silane (BTBAS). A silicon dioxide PMD liner sublayer may be formed by a PECVD process using tetraethyl orthosilicate (TEOS), formally named tetraethoxysilane. A silicon oxynitride PMD liner sublayer may be formed by a PECVD process using BTBAS and TEOS.

The PMD layer 160 may be formed over the PMD liner if present by one or more dielectric deposition processes, including a PECVD process using TEOS, a high-density plasma (HDP) process, or a high aspect ratio process (HARP) using TEOS and ozone, by way of example. The PMD layer 160 may be planarized by an oxide CMP process.

The method 300 continues with step 322, which includes forming the contacts through the PMD layer 160. The contacts create electrical connections to the embedded thermoelectric cooler 102 and the heat generating source 104. The contact holes may be formed by etching contact holes through the PMD layer 160 and the PMD liner if present to expose the metal silicide. In one version of step 322, the contacts may be formed by sputtering titanium to form a titanium adhesion layer, followed by forming the titanium nitride diffusion barrier using reactive sputtering, a CVD process or an ALD process. The tungsten core may be formed by a MOCVD process using tungsten hexafluoride ($WF_6$) reduced by silane initially and hydrogen after a layer of tungsten is formed on the titanium nitride diffusion barrier. The tungsten, titanium nitride, and titanium are subsequently removed from a top surface of the PMD layer 160 by an etch process, a tungsten CMP process, or a combination of both, leaving the contacts extending to the top surface of the PMD layer 160. In another version of step 322, the contacts may be formed by a selective tungsten deposition process which fills the contact holes with tungsten from the bottom up, forming the contacts with a uniform composition of tungsten. Other methods of forming the contacts are within the scope of this step 322.

The method 300 continues with step 324 which includes formation of interconnects. After the formation of contacts, the interconnects are formed over the contacts. In versions of this example in which the interconnects have an etched aluminum structure, the interconnects may be formed by depositing the adhesion layer, an aluminum layer, and an anti-reflection layer, forming an etch mask, (not explicitly shown) followed by an RIE process to etch the anti-reflection layer, the aluminum layer, and the adhesion layer where exposed by the etch mask, and subsequently removing the etch mask. The first level of interconnects form a heat generating source interconnect system 158 and the thermoelectric taps 152. For the embedded thermoelectric cooler interconnect system 156, of this example, three levels of interconnects are used. After the first level of metal is deposited, the first ILD 161 is deposited. After the formation of the first ILD 161, a first level of vias is formed in a process similar to the formation of the contacts. After the formation of the first via level, a second metal level is formed by a similar process to the formation of the first metal level. A second ILD 163, a second level of vias and a third level of metallization are formed by processes similar to the formation of the first level of vias and the second level of metal.

In versions of this example in which the interconnects have a damascene structure, the interconnects may be formed by forming an intra-metal dielectric (IMD) layer (not specifically shown) on the PMD layer 160, and etching the interconnect trenches through the IMD layer to expose the contacts. A barrier liner (not specifically shown) may be formed by sputtering tantalum onto the IMD layer and the PMD layer 160 which is exposed and contacts, and forming tantalum nitride on the sputtered tantalum by an ALD process. A copper fill metal may be formed by sputtering a seed layer, not explicitly shown, of copper on the barrier liner, and electroplating copper on the seed layer to fill the interconnect trenches. Copper and barrier liner metal are subsequently removed from a top surface of the IMD layer 181 by a copper CMP process. Additional layers of interconnects are formed by repetitive steps of ILD formation, via formation and interconnect formation.

In versions of this example in which the interconnects have a plated structure, the interconnects may be formed by sputtering the adhesion layer, containing titanium, on the PMD layer 160 and contacts, followed by sputtering a seed layer, not explicitly shown, of copper on the adhesion layer. A plating mask is formed on the seed layer that exposes areas for the interconnects. The interconnects are formed by electroplating copper on the seed layer where exposed by the plating mask. The plating mask is removed, and the seed layer and the adhesion layer are removed by wet etching between the interconnects. Additional layers of interconnects are formed by repetitive steps of ILD formation, via formation and interconnect formation.

Figure 4:
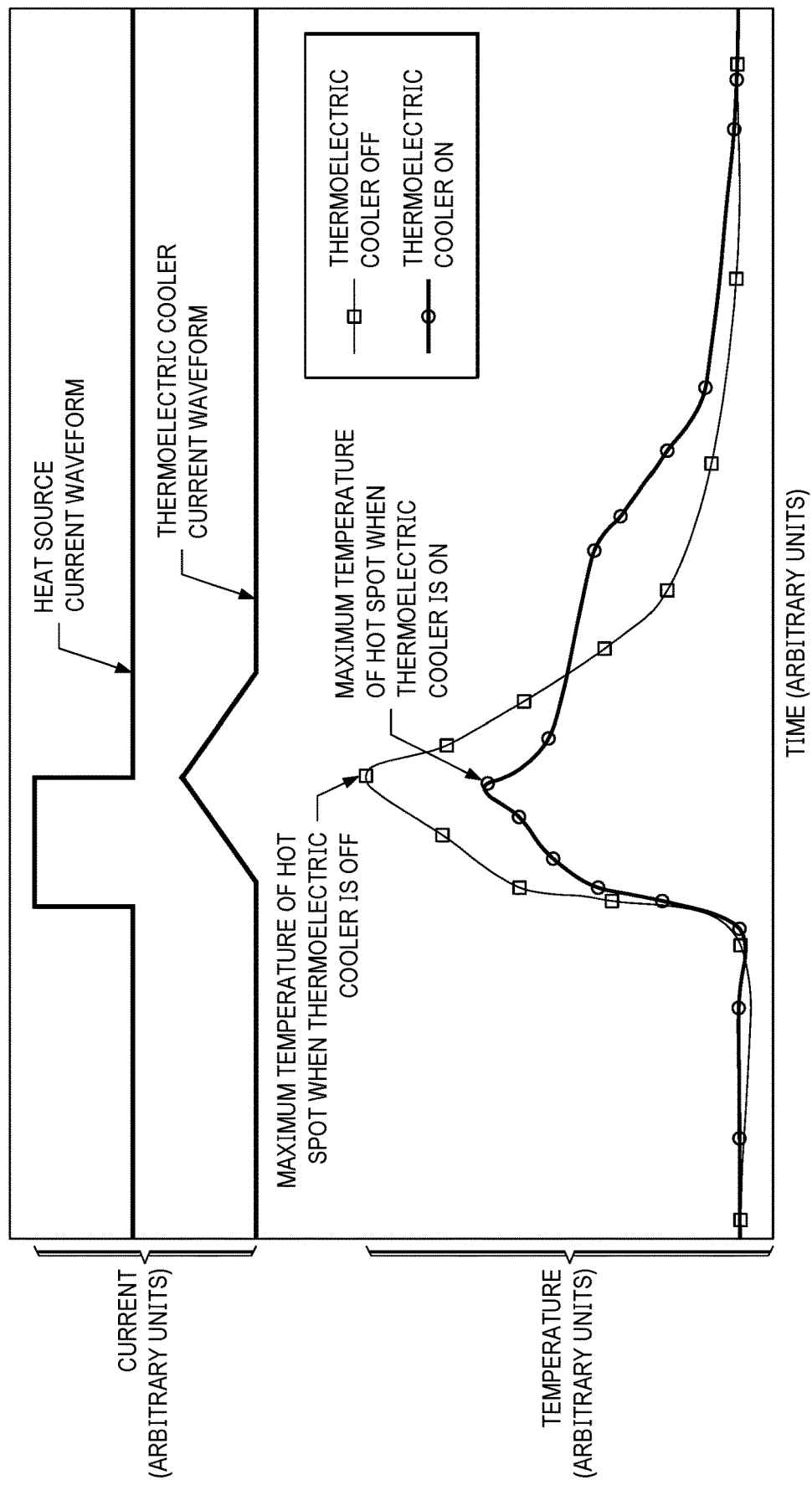
FIG. 4 is a graph presenting a thermal simulation of the reduction in heat generating source temperature when an embedded thermoelectric cooler waveform is applied.

FIG. 4 shows a graph showing a reduction in maximum temperature of the heat generating source 104 shown in FIG. 1A when the embedded thermoelectric cooler 102 is in the on state when the heat generating source 104 is in an on state versus when the embedded thermoelectric cooler 102 is not in the on state when the heat generating source 104 is in an on state. The addition of an embedded thermoelectric cooler 102 and application of a current using a waveform to the embedded thermoelectric cooler 102 to cool the heat generating source 104 is advantageous to improve the SOA of the microelectronic device 100. The uppermost trace in the graph is a simulated waveform of current supplied to the heat generating source 104, the second upper trace is a waveform of the current supplied by an electronic circuit 280 to the embedded thermoelectric cooler 102 of FIG. 1A. While the second upper trace is a triangular waveform, the waveform could be a square waveform, a rectangular waveform, a sinusoidal waveform, or a sawtooth waveform. Other waveforms are within the scope of the disclosure. The third trace (squares) is a simulation of the heat generated at the heat generating source 104 without an applied current to the embedded thermoelectric cooler 102, and the fourth trace (circles) is a simulation of the heat at the heat generating source 104 when a current is applied to the embedded thermoelectric cooler 102. The graph shows that the peak temperature of the heat generating source 104 is lower when a current waveform is applied to the embedded thermoelectric cooler 102 compared to the peak temperature of the heat generating source 104 when a current waveform is not applied to the embedded thermoelectric cooler 102. The current waveform of the heat generating source 104 shown in the uppermost trace is a square waveform. The current waveform of the embedded thermoelectric cooler 102 is offset in time from the application of current to the heat generating source 104. Variation of the length of time the embedded thermoelectric cooler waveform is applied and the offset in time between the application of current to embedded thermoelectric cooler 102 and the heat generating source 104 are within the scope of this disclosure.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present invention should not be limited by any of the above-described examples. Rather, the scope of the disclosure should be defined in accordance with the following claims and their equivalents.

What is claimed is:

1. A microelectronic device, comprising:
   a substrate;
   an embedded thermoelectric cooler in the substrate, the embedded thermoelectric cooler including a cold terminal and a hot terminal, wherein the cold terminal includes first conductivity type thermopiles in a first doped region of the substrate and the hot terminal includes second conductivity type thermopiles in a second doped region of the substrate;
   an array of thermally anisotropic mesas in the substrate between the cold terminal and the hot terminal, wherein the array of thermally anisotropic mesas is in a third doped region of the substrate, the third doped region being different from either the first doped region or the second doped region;
   an interconnect system connecting the cold terminal to the hot terminal; and
   a heat generating source located adjacent to the cold terminal of the embedded thermoelectric cooler.

2. The microelectronic device of claim 1, wherein the heat generating source is a laterally diffused metal oxide semiconductor (LDMOS) transistor.

3. The microelectronic device of claim 1, wherein a gap fill region between the thermally anisotropic mesas is filled with silicon dioxide.

4. The microelectronic device of claim 1, wherein a gap fill region between the thermally anisotropic mesas is filled with polysilicon.

5. The microelectronic device of claim 1, wherein a gap fill region between the thermally anisotropic mesas is filled with an air gap.

6. The microelectronic device of claim 1, further including an electronic circuit contained in the microelectronic device, the electronic circuit configured to generate a waveform for the embedded thermoelectric cooler, the waveform including a square waveform, a rectangular waveform, a triangular waveform, a sinusoidal waveform, or a sawtooth waveform.

7. The microelectronic device of claim 1, wherein the thermally anisotropic mesas are configured as an array of linear thermally anisotropic mesas.

8. The microelectronic device of claim 1, wherein the thermally anisotropic mesas are configured as an array of rectangular pillared thermally anisotropic mesas.

9. The microelectronic device of claim 1, wherein the cold terminal of the embedded thermoelectric cooler is located adjacent to the heat generating source on more than one side.

10. The microelectronic device of claim 1, wherein the third doped region corresponds to a deep well region.

11. The microelectronic device of claim 1, wherein the first and second doped regions correspond to well regions of opposite conductivity.

12. The microelectronic device of claim 1, wherein the first doped region is shared with a body well of the heat generating source.

13. The microelectronic device of claim 1, wherein a germanium implanted region in the substrate encompasses the thermally anisotropic mesas.

14. The microelectronic device of claim 1, wherein:
   a first gap fill region between the thermally anisotropic mesas includes a first trench having a first depth from a surface of the substrate; and
   a second gap fill region between the first conductivity type thermopiles includes a second trench having a second depth from the surface of the substrate, the second depth less than the first depth.

15. The microelectronic device of claim 14, wherein:
   the thermally anisotropic mesas have a first height with respect to a bottom of the first trench; and
   the first conductivity type thermopiles have a second height with respect to a bottom of the second trench, the second height less than the first height.

16. The microelectronic device of claim 1, wherein:
   the second doped region forms a p-n junction in the substrate; and
   the third doped region extends past the p-n junction.

17. A semiconductor device, comprising:
   a substrate;
   a semiconductor component in the substrate;
   a thermoelectric cooler in the substrate, the thermoelectric cooler including:
   a cold terminal having a first thermopile in a first doped region of the substrate, wherein the cold terminal is located adjacent to the semiconductor component;
   a hot terminal having a second thermopile in a second doped region of the substrate; and
   an array of thermally anisotropic mesas in a third doped region of the substrate, the third doped region being different from either the first doped region or the second doped region, wherein the array of thermally anisotropic mesas is located between the cold terminal and the hot terminal.

18. The semiconductor device of claim 17, further comprising:
   an interconnect structure connecting the cold terminal to the hot terminal.

19. The semiconductor device of claim 17, wherein the thermoelectric cooler surrounds the semiconductor component.

20. The semiconductor device of claim 17, wherein:
   the first doped region corresponds to a p-type region in the substrate;
   the second doped region corresponds to a first n-type region in the substrate; and
   the third doped region corresponds to a second n-type region in the substrate.

21. The semiconductor device of claim 17, wherein the thermally anisotropic mesas are configured as linear mesas.

22. The semiconductor device of claim 17, wherein the thermally anisotropic mesas are configured as rectangular pillared mesas.

23. The semiconductor device of claim 17, wherein:
the substrate includes silicon; and
the thermally anisotropic mesas include germanium incorporated into the silicon.

24. The semiconductor device of claim 17, wherein:
the thermally anisotropic mesas have a first height between upper ends and lower ends of the thermally anisotropic mesas; and
the first and second thermopiles have a second height between upper ends and lower ends of the first and second thermopiles, wherein the second height is less than the first height.

25. The semiconductor device of claim 17, wherein:
the semiconductor component is a laterally diffused metal oxide semiconductor (LDMOS) transistor; and
the first doped region including the first thermopile is shared with a body well of the LDMOS.

26. A microelectronic device, comprising:
a substrate;
a thermoelectric cooler in the substrate, the thermoelectric cooler including a cold terminal and a hot terminal, wherein the cold terminal includes first conductivity type thermopiles in the substrate and the hot terminal includes second conductivity type thermopiles in the substrate;
an array of thermally anisotropic mesas in the substrate between the cold terminal and the hot terminal; and
a heat source located adjacent to the cold terminal, wherein:
a first gap fill region between the thermally anisotropic mesas includes a first trench having a first depth from a surface of the substrate; and
a second gap fill region between the first conductivity type thermopiles includes a second trench having a second depth from the surface of the substrate, the second depth less than the first depth.

27. The microelectronic device of claim 26, wherein:
the thermally anisotropic mesas have a first height with respect to a bottom of the first trench; and
the first conductivity type thermopiles have a second height with respect to a bottom of the second trench, the second height less than the first height.

28. The microelectronic device of claim 26, wherein the first trench extends through a doped layer of the substrate, the doped layer being located at a third depth from the surface of the substrate greater than the second depth.

29. The microelectronic device of claim 26, wherein the first gap fill region includes a dielectric layer on the first trench and an electrically conductive material on the dielectric layer.

30. The microelectronic device of claim 26, wherein the first gap fill region includes a dielectric material on the first trench.

31. The microelectronic device of claim 26, wherein the first gap fill region includes a dielectric material and an air gap below the dielectric material.

32. A semiconductor device, comprising:
a substrate of a semiconductor material;
a semiconductor component in the substrate;
a thermoelectric cooler in the substrate, the thermoelectric cooler including:
a cold terminal having a first thermopile in the substrate, wherein the cold terminal is located adjacent to the semiconductor component;
a hot terminal having a second thermopile in the substrate; and
an array of thermally anisotropic mesas of the semiconductor material in the substrate, the array of thermally anisotropic mesas being located between the cold terminal and the hot terminal, wherein:
the thermally anisotropic mesas have a first height between upper ends and lower ends of the thermally anisotropic mesas; and
the first and second thermopiles have a second height between upper ends and lower ends of the first and second thermopiles, wherein the second height is less than the first height.

33. The semiconductor device of claim 32, wherein the first thermopile is in a first doped region of the substrate, the first doped region being shared with the semiconductor component.

* * * * *